ELECTRONIC PIN LOCATOR AND WIRE WRAP TOOL

Filed June 18, 1965 3 Sheets-Sheet 1

INVENTORS
LEONARD J. LULICK
JOHN E. BUTTON

BY Kevin C. McMahon
AGENT

ELECTRONIC PIN LOCATOR AND WIRE WRAP TOOL

Filed June 18, 1965 3 Sheets-Sheet 2

INVENTORS
LEONARD J. LULICK
JOHN E. BUTTON

BY Kevin C. McMahon
AGENT

INVENTORS
LEONARD J. LULICK
JOHN E. BUTTON

BY Kevin C. McMahon
AGENT

United States Patent Office 3,327,374

Patented June 27, 1967

3,327,374

ELECTRONIC PIN LOCATOR AND WIRE WRAP TOOL

Leonard J. Lulick, Garden City, and John E. Button, Livonia, Mich., assignors to Burroughs Corporation, Detroit, Mich., a corporation of Michigan Filed June 18, 1965, Ser. No. 465,061
7 Claims. (Cl. 29—203)

This invention relates generally to pin locators for wire wrapping operations and, more particularly, to an electronic pin locator system for wire wrap tools which automatically verifies the wiring of a terminal board as it is wired.

Various types of standard circuit boards form the building blocks for the logic circuitry in most computers and data processing equipment. A plurality of simple digital circuits such as multivibrators, gating circuits, etc., are assembled on the boards and have their input, output and power supply leads brought out to connector tabs. The connector tabs consist of independent metallic strips located along and perpendicular to one edge of the circuit board.

The edge of the circuit boards with the connector tabs is inserted into terminal boards for connection to other boards and to other parts of the machine. These terminal boards have sockets for receiving a number of circuit boards set in one face and wiring pins corresponding to the connector tabs on the circuit boards projecting from the opposite face. The pins are arrayed in rows and columns, with each pin having a unique matrix designation. Interconnections of circuit boards inserted into a terminal board with each other and with other logic sections of the machine are made with wires wrapped on the pins of the terminal board. It is of paramount importance to avoid mistakes in performing these wiring operations as there may be hundreds of individual terminal boards in a machine and a single wiring mistake may render the entire machine inoperable.

One method used for wiring a terminal board is for the operator to read the location of the first pin to be wired from a wiring sheet and wrap that pin. Then he reads the location of the second pin from the wiring sheet and wraps the other end of the wire around that pin. The operator has to use complicated matrix designations in locating each pin so that this method has a high propensity for error. Since thousands of such connections have to be made in wiring a single computer, the making of a significant number of errors has not been uncommon.

No provision has heretofore been made for verifying the wiring as it was being done so that errors were often not discovered until the entire machine or section of the machine was assembled and dynamically tested. Technicians and engineers then had to go over the entire machine, looking for each wiring error, and debugging time, was, therefore, a significant factor in the cost of the machine. Also, sensitive electronic components were often damaged or destroyed by the application of incorrect voltages to them during dynamic testing.

It is, therefore, an object of our invention to prevent errors in the wiring of the terminal boards.

A further object of our invention is to prevent damage to sensitive electronic components by insuring that wiring operations on terminal boards are performed correctly.

A further, more specific, object of our invention is to prevent mistakes in the wiring of terminal boards by providing electrical means in conjunction with the wiring gun and the board to be wired for verifying each wiring connection before the wrapping of the wire on the selected pins is completed.

In carrying out these and other objects of our invention, we provide coupling means for interconnecting corresponding pins on a prewired master terminal board and a workboard which is to be identically wired. Electrical signal means are attached to a standard wirewrap gun for indicating whether the operator has selected the proper pins for wrapping in each connection on the workboard after he has wrapped the wire to the first pin of the connection.

Various objects, advantages, and features of our invention will become more fully apparent from the following specification with its appended claims, and accompanying drawings, in which:

Figures 1, 2, 3:
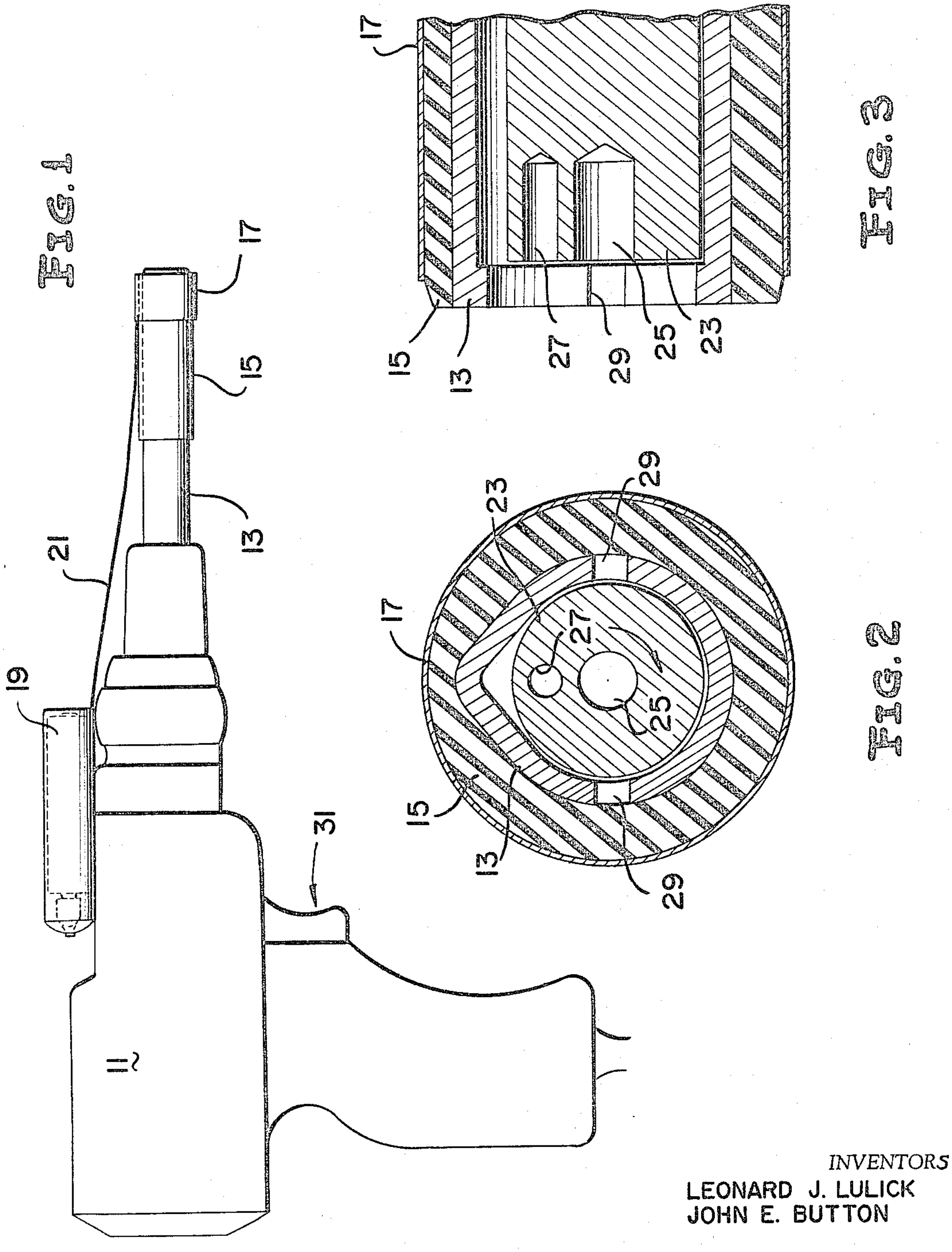
FIG. 1 is a side view of a wiring gun modified according to the principles of applicants' invention.
FIG. 2 is a front view of the barrel of the modified gun of FIG. 1.
FIG. 3 is a cutaway side view of the leading portion of the barrel of the modified gun of FIG. 1.

Our invention can best be understood by referring to the following detailed description of the illustrated embodiment:

Referring to FIG. 1 of the drawings, a commercial wire wrap gun 11 has been modified to have the forward portion of its barrel 13 covered by insulating sleeve 15. A metallic tip 17 coaxially surrounds the leading edge of the insulating sleeve 15. A two-terminal, battery operated lamp 19 is attached to the body of the gun 11 with one terminal connected to the metallic tip 17 by means of insulated wire 21 and the other terminal connected to the body of the gun 11 through the lamp casing.

FIGS. 2 and 3 show the forward end of the barrel 13 encircled by insulating sleeve 15 and metallic tip 17. Rotatable shaft 23 housed in barrel 13 has an axial hole 25 bored therein for allowing the shaft 23 to be placed over the pin to be wrapped. An offset hole 27 is bored into the shaft 23 for holding the end of the wire to be wrapped around the pin. Wire directing notches 29 orient the free end of the wire in the desired direction. As the gun is constructed of metal, an electrically conductive path exists from the body of the gun to the shaft 23 and offset hole 27. When the operator depresses the trigger 31 (FIG. 1), the shaft 23 whirls, wrapping the end of the wire inserted into the offset hole 27 around the pin in axial hole 25, as is well-known in the art.

Figure 4:
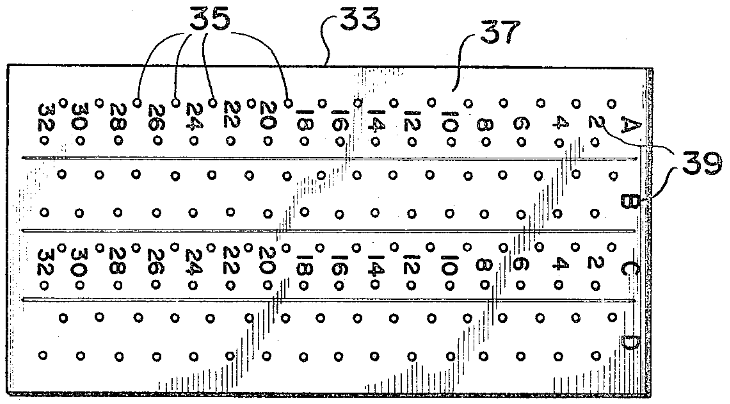
FIG. 4 is a top view of a terminal board showing the arrangement and numbering of the pins.

A work terminal board 33, as illustrated in FIG. 4, is well-known in the art. It has, in the illustrated embodiment, sockets for four circuit boards set in its lower face (not shown). Pins 35 corresponding to the connector tabs of the circuit boards are arranged in rows and columns along the upper face 37 of the board 33 and are connected individually to corresponding sockets for the connector tabs in the lower face of the board, as is well-known. Matrix designations 39 are printed on the upper face 37 of the board 33 for allowing the operator to locate each pin 35 uniquely.

Figure 5:
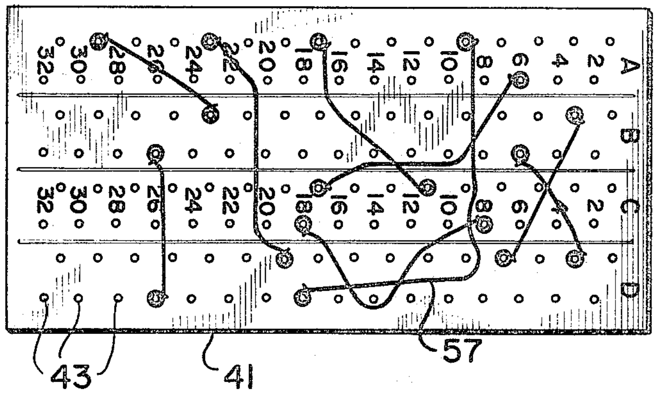
FIG. 5 is a top view of a pre-wired master terminal board, showing the proper pins interconnected.

The master terminal board 41 of applicants' device, as shown in FIG. 5, is substantially identical with the conventional workboard 33 of FIG. 4 except that the proper pins are already wired together.

Figure 6:
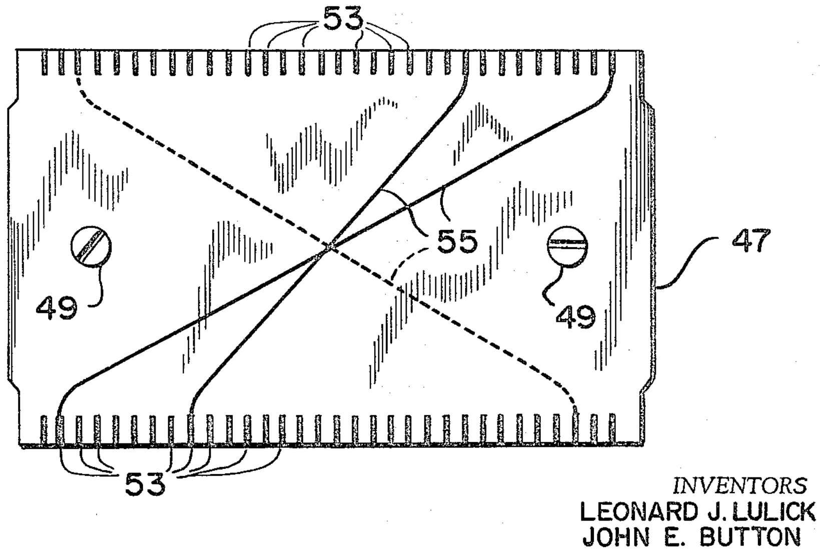
FIG. 6 is a top view of a parallel coupler showing an example of the connector tabs and cross wiring.
Figure 7:
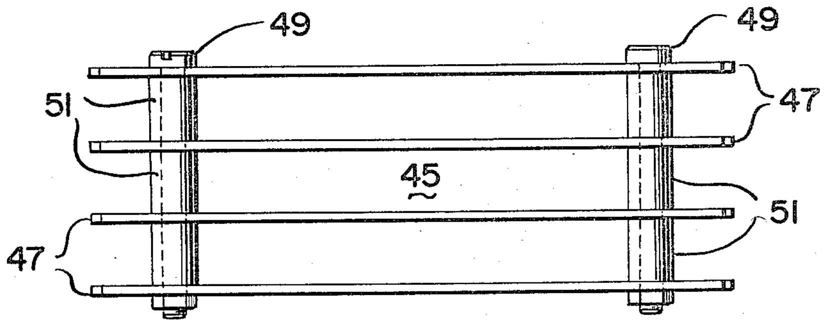
FIG. 7 is an edge view of the parallel coupler of FIG. 6.

The corresponding pins 35 and 43 of the master terminal board and workboard are connected by a parallel coupler 45, as shown in FIGS. 6 and 7. The coupler 45, as illustrated consists of four modified circuit boards 47 which are held together in spaced relationship by bolts 49 and spacers 51 so that they will fit into the sockets of the terminal boards 33 and 41. Connector tabs 53 are arrayed along opposite edges of the circuit boards 47 to fit the sockets in the back faces of the master and work terminal boards 41 and 33. A conventional circuit board would have tabs along only one edge. Wires 55 connect the tabs 53 on one edge of the boards 47 to the tabs on the other edge of the boards 47. For ease in drawing, only a few of the wires 55 are shown in FIG. 6; it will, of course, be understood that all of the tabs 53 are so interconnected and that other connections, such as printed circuits, may be used in lieu of wires 55.

Figure 8:
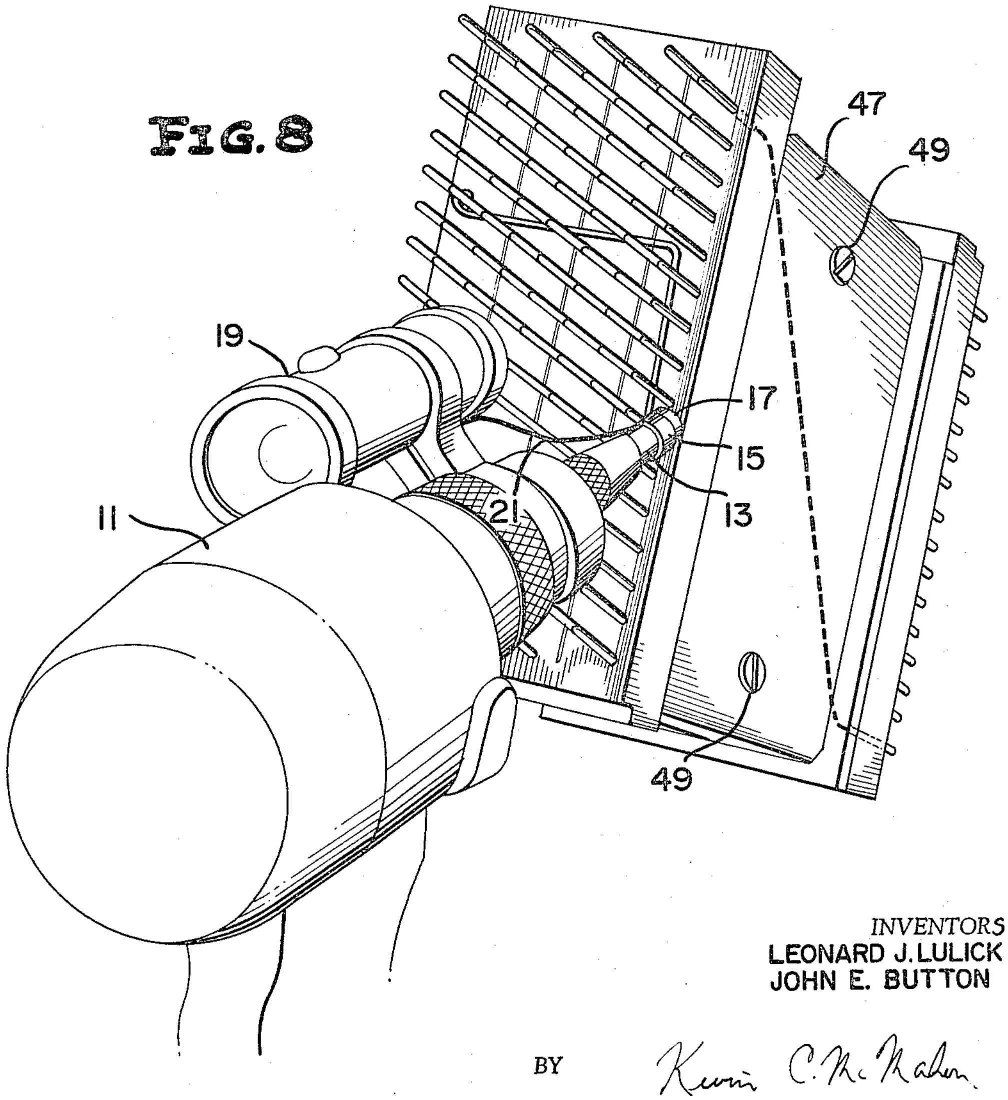
FIG. 8 is an isometric view of a system embodying our invention, showing the modified wiring gun, work board, parallel coupler and master board assembled in operative relationship.

The boards 33 and 41 and coupler 45 are assembled as shown in FIG. 8 with the opposite edges of the parallel coupler 45 inserted into the sockets of workboard 33 and master board 41 so that the wires 55 interconnecting the tabs on the parallel coupler 45 couple the corresponding pins 35 and 43 on the master and work terminal boards 41 and 33, respectively.

If the operator is to connect two pins, for instance, pins A–9 and D–18, on the work terminal board 41, he first wraps one end of the wire around pin A–9 and inserts the free end of the wire into the off-center hole 27 in the rotatable shaft 23 of the wiring gun 11. Next he touches metallic tip 17 to pin D–18. If he has touched the correct pin, and if he has wrapped the other end of the wire correctly to pin A–9, a closed circuit will exist from end of the lamp 19 through the body of the gun 11 to the wire to be wrapped, and from there to pin A–9. The parallel coupler 45 interconnects the pins A–9 on the work board 33 and master board 41. Wire 57 (FIG. 8) connects pins A–9 and D–18 on the master terminal board 41. The parallel coupler 45 completes the circuit from pin D–18 on the master board 41 to pin D–18 on the work board 33 and from there, through the metallic tip 17 to the other terminal of the battery operated lamp 19. Thus, if the operator has selected the correct pins to be wired, the lamp 19 will light. However, if he has made a mistake in wrapping the first pin, or if he has not located the pin D–18 correctly, the circuit will not be completed and the lamp will not light. Thus, any mistake in the wiring will be immediately evident and can be easily corrected, before the wire connection is completed.

It is, of course, obvious that the wiring of any terminal board accommodating any number of circuit boards can be checked as the terminal boards are being wired by the use of our invention. Also, indicating lamp 19 could be replaced by any suitable visual or audible indicating means.

The above description is by way of illustration only and it would be obvious to one skilled in the art that variations could be made in the embodiment in which our invention is practiced.

We claim:

1. A pin locator apparatus for use in conjunction with a commercial wire-wrap gun in verifying the selection of pins to be wrapped on a work terminal board as they are being connected with a wire, said gun having an electrically conductive path between its body and its wire holding means, and each of said pins having a wiring end and a socket end, comprising a pre-wired master terminal board, means electrically coupling the socket ends of corresponding pins on the work terminal board and the master board, a conducting tip attached to, and insulated from, the barrel of said wiring gun, and two terminal electrical means having one terminal attached to said conductive tip and the other terminal attached to the body of said gun, for indicating the proper connection of two pins on said work terminal board, after wrapping the first pin and inserting the free end of the wire into said wire holding means, upon touching said conductive tip to the second pin.

2. The device of claim 1 in which said indicating means comprises a battery-operated lamp carried by said gun.

3. The device of claim 1 in which said coupling means comprises a plurality of connector boards having connector tabs arrayed along opposite edges thereof, said connector boards being joined together in spaced relationship for insertion into the sockets of said pins of said terminal boards, and means electrically interconnecting selected tabs on one edge with individual tabs on the other edge of each of said connector boards.

4. Apparatus for use in conjunction with an electrically conductive wire wrap gun for checking the wiring of pins on a terminal board while the connection of the pins with wires is being performed, comprising means for temporarily conductively interconnecting the pins to be wired on said terminal board in accordance with a predetermined wiring pattern, electrical terminal means insulated from said gun, and two terminal electrical means having one terminal coupled to said gun and the other terminal coupled to said electrical terminal means for indicating the proper connection of the pins on the terminal board while the proper pins are interconnected by said interconnecting means after wrapping the wire to a first pin and inserting the free end of the wire into the gun upon touching the terminal means to a second pin to be permanently connected to said first pin in accordance with said predeterined wiring pattern.

5. The apparatus of claim 4 wherein said temporary interconnecting means comprises a prewired master terminal board, and means electrically coupling selected pins on the master board and the terminal board to be wired.

6. The apparatus of claim 5 wherein said coupling means comprises connector boards having conductive tabs arranged along opposite edges thereof, said connector boards being held together in spaced relationship for electrical interconnection with said terminal boards by said opposite edges, and means electrically interconnecting each tab on one edge with a respective tab on the other edge of said connector board.

7. A testing apparatus for checking the wiring of the pins of a work terminal board as it is being wired, said pins being arrayed on one side of said terminal board and connected individually to sockets in the opposite side of said board, comprising a master terminal board substantially corresponding to said work terminal board and having its pins interconnected in exact correspondence to a properly wired work terminal board, a parallel coupler for connecting said sockets on the work terminal board to the corresponding sockets on the master board, a wire wrap gun having a rotatable shaft for wrapping the wire to the pin to be wired and a conductive path from the body of said gun to said rotatable shaft, a conductive tip attached to and insulated from the forward end of the barrel of said wire wrap gun, and a battery operated lamp attached to said gun having one terminal thereof connected to said gun and the other terminal connected to said conductive tip for indicating the proper choice of pins to be wired on said terminal board after wrapping a wire to a first pin and inserting the other end of the wire into said gun, upon touching said conductive tip to a second pin.

References Cited

UNITED STATES PATENTS

| | | | |
|---|---|---|---|
| 2,139,860 | 12/1938 | Schwendeman | 35—40 |
| 2,926,859 | 3/1960 | Bos et al. | 140—124 X |
| 2,955,769 | 10/1960 | Boswell et al. | 242—7 |
| 3,163,926 | 1/1965 | Gray | 29—203 |

JOHN F. CAMPBELL, *Primary Examiner.*

THOMAS H. EAGER, *Examiner.*